United States Patent [19]

Laub

[11] Patent Number: 5,307,014
[45] Date of Patent: Apr. 26, 1994

[54] INFLOW MR ANGIOGRAPHY WITH SPATIALLY VARIABLE FLIP ANGLES

[75] Inventor: Gerhard Laub, Edison, N.J.

[73] Assignee: Siemens Medical Systems, Inc., Iselin, N.J.

[21] Appl. No.: 779,228

[22] Filed: Oct. 18, 1991

[51] Int. Cl.⁵ ............................................. G01V 3/00
[52] U.S. Cl. .................................. 324/306; 128/653.3
[58] Field of Search ............... 324/300, 307, 308, 309, 324/318, 322, 306; 128/653.3

[56] References Cited

U.S. PATENT DOCUMENTS

| | | | |
|---|---|---|---|
| 4,703,274 | 10/1987 | Kaufman et al. | 324/309 |
| 4,707,659 | 11/1987 | Kunz et al. | 324/309 |
| 4,710,718 | 12/1987 | Shaka | 324/309 |
| 4,866,386 | 9/1989 | Sattin | 324/314 |
| 4,983,921 | 1/1991 | Kramer et al. | 324/309 |
| 5,027,070 | 6/1991 | Higuchi | 324/309 |

FOREIGN PATENT DOCUMENTS 0439119 7/1991 European Pat. Off. .

OTHER PUBLICATIONS

Intracranial Circulation: Pulse-Sequence Considerations in Three-dimensional (Volume) MR Angiography; Jun. 1989; pp. 785-791.
Nuclear Magnetic Resonance Signal From Flowing Nuclei In Rapid Imaging Using Gradient Echoes; Medical Physics Nov./Dec. 1988; pp. 809-814.
MR Angiography By Multiple Thin Slab 3D Acquisition; Magnetic Resonance in Medicine Feb. 1991; pp. 434-451.
Multiple-Readout Selective Inversion Recovery Angiography; Magnetic Resonance in Medicine 1991 Jan.; pp. 244-251.
Variable Excitation Angle AFP Pulses; Magnetic Resonance in Medicine 1989 Mar.; pp. 435-440.
"Improvement of 3-D Acquisition and Visualization in MRI", published in Magnetic Resonance Imaging, vol. 9, No. 3, 1991, pp. 001-013.
"Time-of-Flight MR Flow Imaging: Selective Saturation Recovery With Gradient Refocusing", published in Radiology, 1986, No. 160, pp. 781-785.
3-D MP RAGE—Mugler III Jr., Brookman, Jr., "3-Dimensional Magnetization—Prepared Rapid Gradient—Echo Imaging (3-D MR RAGE)" published in Magnetic Resonance Med. 15, 1990, pp. 152-157.
"MR Angiography With Gradient Motion Refocusing" by Laub G. A., and Kaiser W. A. published in Journal of Computer Assisted Tomography 12(3), 1988, pp. 377-382.
"Flow, Radiofrequency Pulse Sequences, and Gradient Magnetic Fields: Basic Interactions and Adaptation to Angiographic Imaging" published in Topics in Magnetic Resonance Imaging, vol. 3, Issue 3, 1991, pp. 1-11.

*Primary Examiner*—Louis Arana
*Attorney, Agent, or Firm*—Lawrence C. Edelman; Richard M. Ludwin

[57] ABSTRACT

In a 3-D magnetic resonance flow imaging apparatus, the RF excitation field is applied so as to produce a spatial variation of the nuclear spin flip angle within the imaging volume. The spatial variation results in nuclear spins at the volume entrance plane experiencing a relatively small flip angle, and experiencing progressively larger flip angles as they progress into the volume.

2 Claims, 5 Drawing Sheets

3D VOLUME

N PARTITIONS

FLOW DIRECTION

INFLOW MR ANGIOGRAPHY WITH SPATIALLY VARIABLE FLIP ANGLES

BACKGROUND OF THE INVENTION

1. Field of the Invention

The present invention relates to magnetic resonance (MR) imaging and, more particularly, to volumetric MR imaging of flow, i.e., 3-D MR angiography.

2. Description of the Prior Art

Any nucleus which possesses a magnetic moment will attempt to align itself with the direction of an applied magnetic field. In doing so, however, the nucleus processes around this direction at a characteristic angular frequency (the Larmor frequency) which is dependent on the strength of the magnetic field and on specific properties of the nuclear species (the magnetogyric constant of the nucleus).

When a substance such as human tissue is subjected to a static uniform magnetic field (polarizing field $B_o$), the individual magnetic moments of paramagnetic nuclei in the tissue, in their attempt to align with this field, process about it in random order at their characteristic Larmor frequency. The net magnetic moment $M_O$ includes a component $M_L$ produced in the direction (z) of the polarizing field, however, the randomly oriented components $M_T$ in a plane which is transverse to the plane of the polarizing field (i.e., the x-y plane) cancel one another. If, however, the substance, or tissue, is irradiated with an additional magnetic field (RF excitation field B1), which is in the x-y plane and which is near the Larmor frequency, the longitudinal component of the magnetic moment $M_L$ can be rotated (flipped) into the x-y plane to produce a net transverse magnetic moment $M_T$ which is rotating in the x-y plane at the Larmor frequency. The degree to which the $M_L$ component is rotated into an component is referred to as the flip angle. The magnitude and the direction of the net magnetic moment ($M = M_L + M_T$) depends primarily on the amplitude and duration of the applied RF excitation field B1.

One practical value of this gyromagnetic phenomena resides in the radio frequency signal which is emitted as a result of the net transverse magnetic moment $M_T$. A commonly used technique, referred to in the art as a "pulsed NMR measurement", applies the excitation field B1 for a short interval, and then receives the signal that is produced by the resulting transverse magnetic moment $M_T$. Such pulsed NMR measurement cycles may be repeated many times to make the same measurement at different locations in the subject or to make different measurements using any of a number of preparative excitation techniques.

In MR imaging, magnetic field gradients are used in addition to the static magnetic field. Since the resonant frequency of the processing nuclei depends upon the precise magnetic field strength imposed upon it, the applied field gradients are used to provide a mechanism which encodes spatial information into the sensed frequency response signals. MR imaging devices correlate signal intensity at a given frequency with nucleus concentration and relaxation parameters at a given location. This provides spatial information which is used to make a map or image of the object, based upon signal intensity variations due to the concentration and/or relaxation time differences. Such techniques are now routinely used to form MR medical diagnostic devices which provide two-dimensional (2-D) images. Many pulse and gradient sequence variations are also known which can be used to enhance the diagnostic value of the images produced.

Until recently, the application of 3-D visualization methods in MR diagnostic imaging was rather tedious. Traditional 2-D acquisition techniques were not able to produce quality sufficient for 3-D display in a time frame which can be tolerated by a patient. Recent developments, such as described in my paper entitled "IMPROVEMENT OF 3-D ACQUISITION AND VISUALIZATION IN MRI" published in Magnetic Resonance Imaging, Vol. 9, No. 3, 1991, Pages 001-013 describes improvements in 3-D techniques which make 3-D MR imaging more attractive for medical diagnostic use.

One emerging MR imaging modality is flow or vascular imaging. One basic physical principle which is used to acquire flow images in the MR environment uses time-of-flight effects. Time-of-flight effects are based on the macroscopic motion of nuclear spins with longitudinal magnetization. Typically, the magnetization of a bolus of blood is labelled at one time (via a selective RF excitation) and detected at a later time (at readout). Because the bolus changes location between labelling and detection, the name time-of-flight is used. Inflow enhancement is a special case of time-of-flight, in which the bolus is excited and detected in the same slice. An example of inflow enhancement effects in MR imaging is shown in FIG. 1a, wherein the flow is perpendicular to the slice plane. During a single repetition time, some of the spins flow out of the slice and are replaced by others flowing into the slice. Repeated MR imaging sequences result in the stationary tissue becoming partially or fully saturated after a few repetition times, thereby diminishing any signal from the stationary tissue. The blood flowing into the selected slice provides unsaturated spins which produce high signal and high contrast relative to that of the adjacent stationary tissue. Thus, if the excitation pulse repetition time (TR) is short relative to the time required for the longitudinal magnetization to become substantially relaxed (T1), over the course of several TR intervals signal from stationary tissue will be attenuated as their spins become more and more saturated. Unfortunately, the flowing blood will also become partially saturated, which saturation manifests itself as a reduction in signal. However, some partially saturated spins in the blood will flow out of the slice and are replaced by unsaturated spins which have higher signal capability. As more unsaturated spins flow into the slice during each TR, more signal is available. The flow signal is maximized when all the partially saturated flowing spins in the slice are replaced each TR. Thus, signal enhancement is directly related to the flow velocity and slice thickness. Further information relating to time-of-flight effects can be found in the article "Time-of-Flight MR Flow Imaging: Selective Saturation Recovery with Gradient Refocusing", published in Radiology, 1986, No. 160, Pages 781-785.

Inflow enhancement also occurs in 3-D volume imaging. 3-D imaging sequences primarily differ from 2-D sequences in that a second spatial encoding gradient is used in combination with the RF excitation pulse to divide the imaging volume into N partitions. In 3-D imaging however, large volumes with many phase encoded partitions (N) results in saturation of flowing spins in the same manner as described above in 2-D imaging if velocities are low. As spins become progressively more saturated, they produce less transverse magnetization ($M_T$), and consequently less signal, so enhancement will not be seen throughout the entire axial length of the volume, as shown in FIG. 1b. An illustration of the progressive saturation effects upon the net transverse magnetization is shown in FIG. 2 for flowing material at the flow entrance plane of the volume and again at the flow exit plane. The rate of signal attenuation depends primarily upon the repetition time TR, flip angle $\alpha$, and the longitudinal relaxation time T1.

Although various techniques such as Gradient Motion Rephasing (GMR), pulse sequences such as FISP (Fast Imaging with Steady Precession), FLASH (Fast Low Angle Shot), and MP RAGE (Magnetization Prepared Rapid Gradient Echo) and other techniques such as described in my above-mentioned paper, as well as my article entitled "INTRACRANIAL CIRCULATION: PULSE-SEQUENCE CONSIDERATIONS IN 3-DIMENSIONAL (VOLUME) MR ANGIOGRAPHY" published in Radiology 1989, Vol. 171, June 1989, Pages 785-791, are available, improvement is still desirable in order to overcome the problem illustrated in FIGS. 1b and 2. With existing MR angiographic techniques, a compromise between volume size, vessel contrast and scan time is made. As an example, the slab thickness must be relatively thin to avoid excessive spin saturation. In order to cover a sufficiently large area of the vasculature, the measurement has to be repeated at different positions, which undesirably increases the overall scan time.

The present invention is directed to reducing the effect of spin saturation which occurs when spins are repeatedly imaged while moving through a selected volume, without increasing the scan time and at the same time minimizing the requirement to modify existing hardware and software.

SUMMARY OF THE INVENTION

In accordance with the principles of the present invention, the RF excitation applied to an imaging volume is modified so as to cause a spatially dependent variation in RF excitation within the imaging volume.

In accordance with one aspect of the invention, the RF excitation is applied so as to cause the spins to experience an increasing flip angle as they proceed through the imaging volume.

In accordance with a further aspect of the invention, this variation in flip angle is provided for in a manner to compensate the partial saturation of the spins as they move through the imaging volume, and thereby cause their transverse magnetization ($M_T$) and hence signal strength, to remain substantially constant as they move through the imaging volume.

These variations in flip angle can be produced by specifically designed RF coils, or by application of a specific RF pulse. Furthermore, the coils and/or pulse may be symmetrically applied to the volume, or may be asymmetrically applied in conjunction with adjacent presaturation pulses for artifact suppression.

DETAILED DESCRIPTION OF THE PREFERRED EMBODIMENTS

Figure 3A:
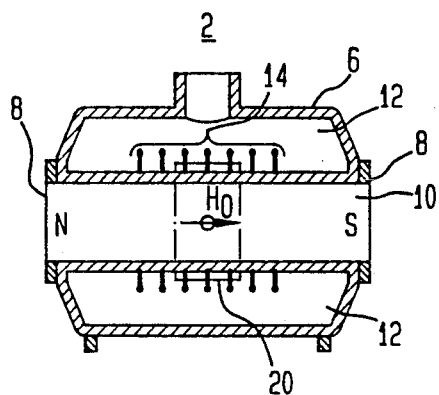
FIGS. 3a, 3b, and 3c illustrate the components of a typical MR imaging device, partially in block diagram form and partially in cross-sectional and perspective view form.
Figure 3B:
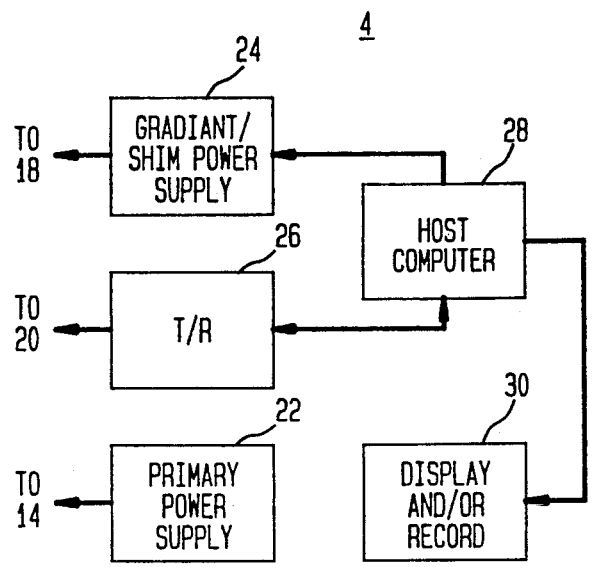
Figure 3C:
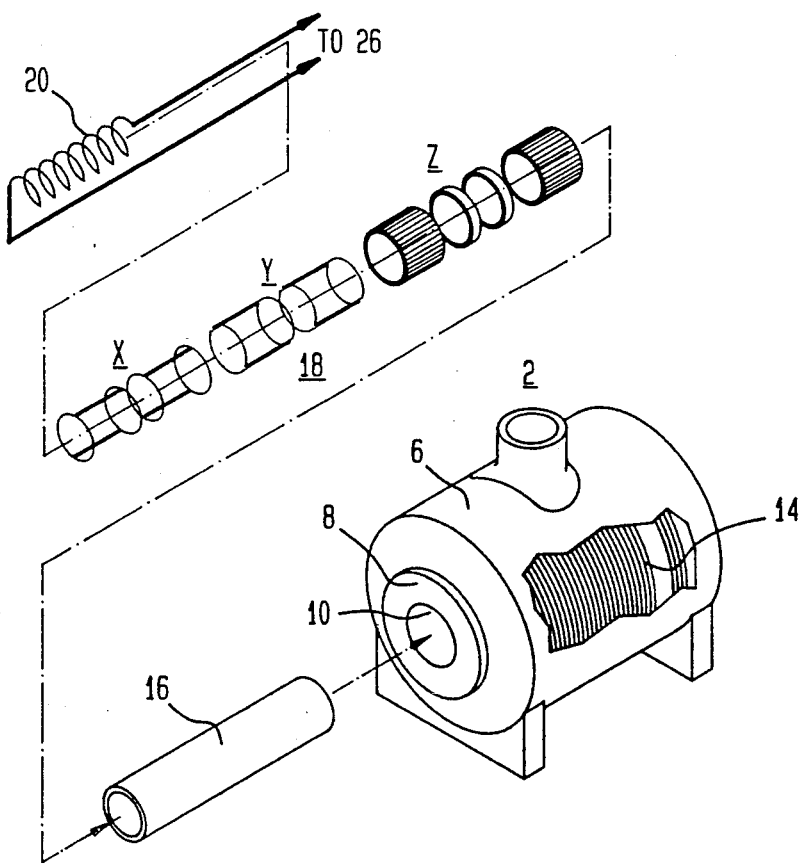

FIGS. 3a and 3b illustrate a cross-section view of a superconducting magnet assembly 2 and a block diagram of an associated electronic system 4, respectively, for operating magnet 2 and developing an image of a test object (not shown) placed therein. FIG. 3c illustrates a perspective view of magnet 2 with a cut-out to show its superconducting magnetic field windings. Superconducting magnet 2 includes a cylindrical housing 6 and end plates 8 having a hole in the center thereof for allowing the test object to be placed in a cylindrical bore 10 of magnet 2. A cylindrical vessel 12 within housing 6 includes a base (main) magnetic field winding 14 for developing a base magnetic field $B_Z$ which is axially aligned within bore 10.

For providing a high magnetic field, i.e., in the order of 1-10 tesla, winding 14 is supercooled by submersion in liquid helium contained within the walls of vessel 12. Although not shown in detail, vessel 12 typically includes a metallic chamber containing liquid nitrogen, which surrounds an additional metallic chamber containing liquid helium. Furthermore, at least one set of radiation shields is typically included within chamber 12 for providing insulation between the liquified gases and reduction of their evaporation rate due to thermal radiation.

As shown in FIG. 3c, a gradient coilfomer 16 serves as a mounting for gradient coil assembly 18 having X, Y and Z gradient coils and a radio frequency (RF) coil 20. The gradient coil assembly with RF coil is then positioned inside bore 10 or magnet 2.

Electronic system 4 includes a primary power supply 22 for supplying current (at east initially) to primary winding 14, a gradient/shim power supply 24 for supplying currents to gradient winding assembly 18 (and shim coils, not shown) and a transmit and receive (T/R) module 26 which transmits RF energy to RF coil 20 and receives magnetic resonance (free induction decay - FID) signals picked up by coil 20 which result from the processing of the protons in the test object. A host computer 28 controls the application of gradient signals to gradient coil assembly 18 and, via its connection to T/R module 26, controls the processing of transmission and reception signals to and from RF coil 20. T/R module 26 and host computer 28 processes the received signals in a well known manner using two-dimensional Fourier transformation techniques for developing an image signal of the test object which is then used to display and/or record the information via display/record unit 30. The above-described apparatus is constructed and operates as a conventional MR device of the type well known to those skilled in the art and commercially available from a variety of manufacturers. In particular, it may comprise a Magnitom 63SP MR imaging system available from Siemens Medical Systems, Iselin, New Jersey.

In operation, gradient coils 18 generate substantially constant magnetic field gradients $G_x$, $G_y$, $G_z$ in the same direction as the main magnetic field, wherein the gradients are directed in mutually orthogonal X-, Y-, and Z-axis directions of a Cartesian coordinate system. That is, if the magnetic field generated by main magnet 14 is directed in the Z direction and is termed $B_o$ and the total magnetic field in the Z direction is referred to as $B_z$, then $G_x = \delta B_z/\delta x$, $G_y = \delta B_z/\delta y$ and $G_z = \delta B_z/\delta z$, and the magnetic field at any point (x, y, z) is given by $B(x,y,z,) = B_o + G_x X + G_y Y + G_z Z$.

As well known, the gradient magnetic fields are utilized in combination with RF excitation pulses supplied from T/R module 26 to encode spatial information into the MR signals (FID's) emminating from a slice of the test object being studied. In operation RF coil 20 selectively excites certain nuclei within the test object, and thereafter receives FID signals from the excited nuclei as they return to an equilibrium position established by the base and gradient magnetic fields.

Figure 1A:
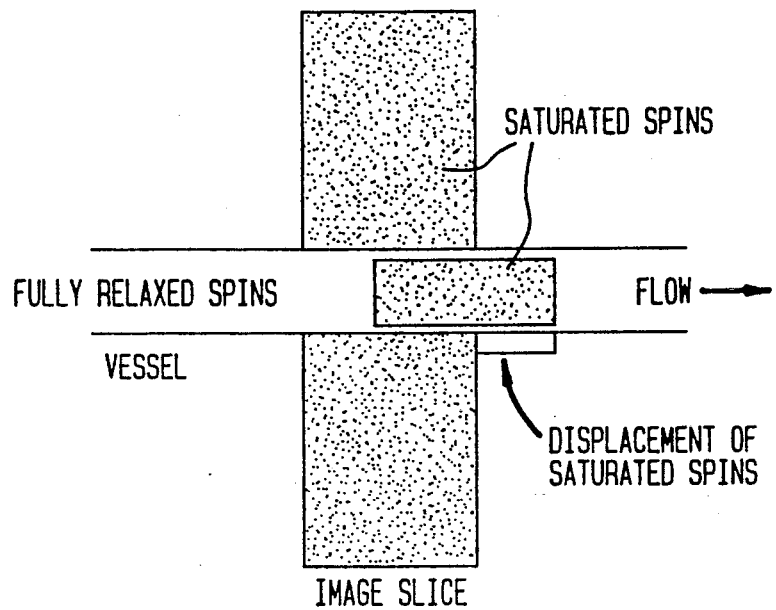
FIG. 1a illustrates the basic idea of inflow enhancement where fully relaxed spins replace partially saturated spins in the imaging slice.
Figure 1B:
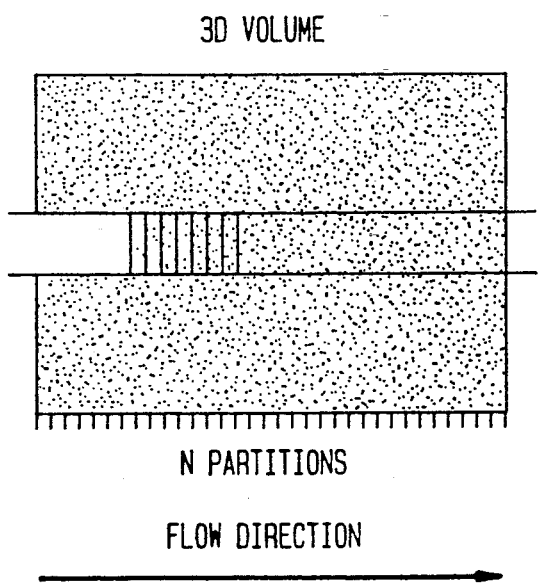
FIG. 1b shows inflow enhancement in the entrance slices of a 3-D volume and also indicates a problem in the prior art 3-D inflow MRA wherein inflow enhancement does not provide sufficient contrast throughout the entire imaging volume.
Figure 2:
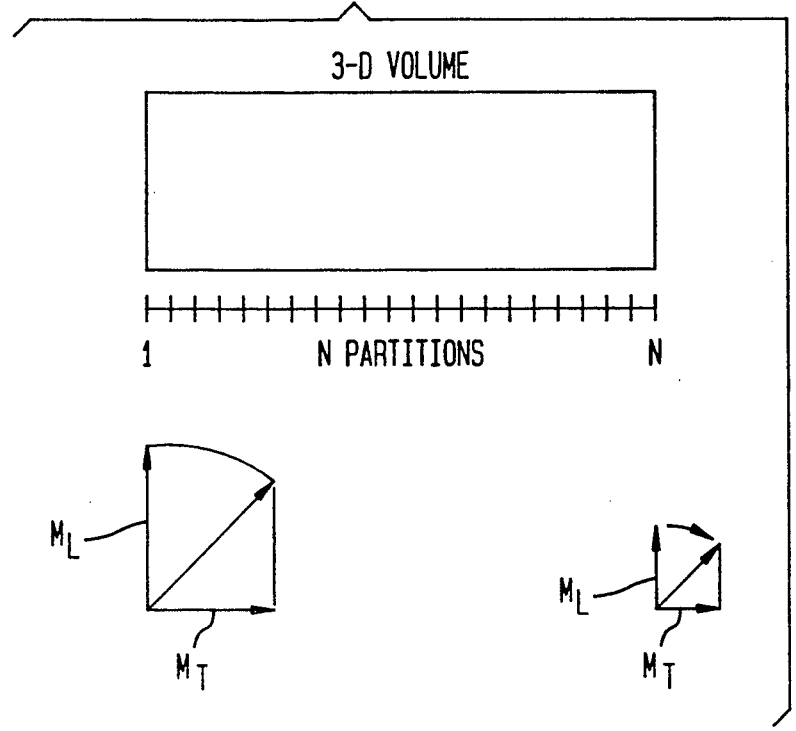
FIG. 2 illustrates the physics responsible for the effects shown in FIGS. 1a and 1b.
Figure 4:
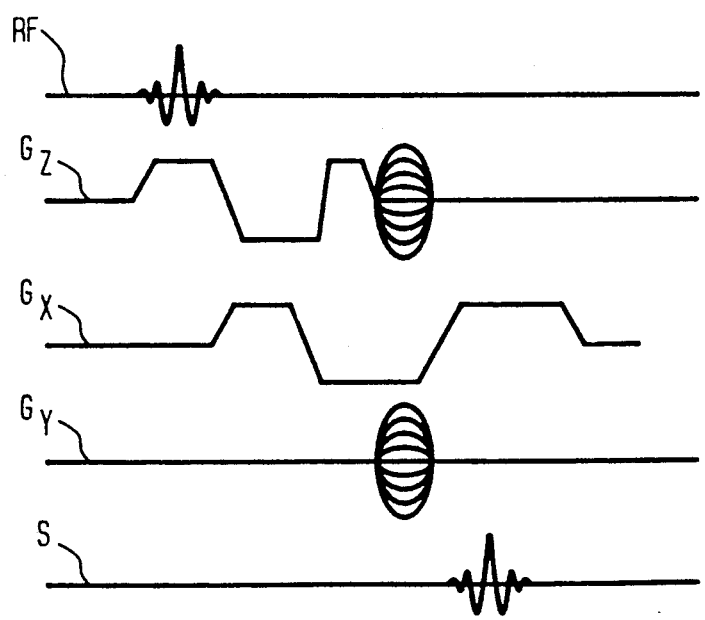
FIG. 4 illustrates a generic 3-D pulse sequence useful for 3-D MR imaging of the type described in the present embodiment.

FIG. 4 illustrates a generic prior art 3-D pulse sequence, useful for obtaining 3-D MR imaging. The phase encoding gradient $G_y$ is conventional, as used in 2-D imaging, and the slice encoding gradient $G_z$ is conventional, as used in 3-D imaging, for partitioning the imaging volume. Both slice select and readout gradients are flow compensated to remove phase effects caused by the motion of spins along the imaging gradients. Further details concerning the selection of pulse sequences for 3-D imaging are described in my above-noted articles disclosed in the Magnetic Resonance Imaging and Radiology publications. Additional variations may be made depending upon the precise hardware and software configurations available to the user and the desired image characteristics. See for example the following articles: Mugler III Jr, Brookeman Jr., entitled "Three-Dimensional Magnetization—Prepared Rapid Gradient—Echo Imaging (3-D MR RAGE)" published in Magn. Reson. Med. 15, Pages 152-157, 1990; an article entitled "Three Second Clinical NMR Images Using a Gradient Recalled Acquisition in a Stready State Mode (GRASS)" by Utz JA, et al., Mag. Reson. Imaging, 4,106,1986 (Abstract); and articles about FISP (Fast Imaging With Steady Precession) such as disclosed by Oppelt, A. and Graumann, R. et al., in Electromedica 54:15; 1986.

Post processing of the acquired 3-D data can be accomplished in a great variety of well known ways. One technique used by the present inventor for 3-D MR angiography is Maximum-Intensity Projection. This is a ray tracing technique for 3-D imaging reconstruction where only the maximum value of each intensity profile (each profile formed by a projection of parallel rays through the tomographic volume) is written into the projected image plane. This technique is described more fully in my fore-noted article published in Radiology, as well an article entitled "MR Angiography with Gradient Motion Refocusing" by Laub GA, and Kaiser WA, published in J. Comput Assist. Tomogr. 1988; 12; 377–382.

In view of the above description, and the current state of MR technology, no further description is deemed necessary to enable one of ordinary skill in the art to practice various basic forms of 3-D MR imaging.

Figure 5:
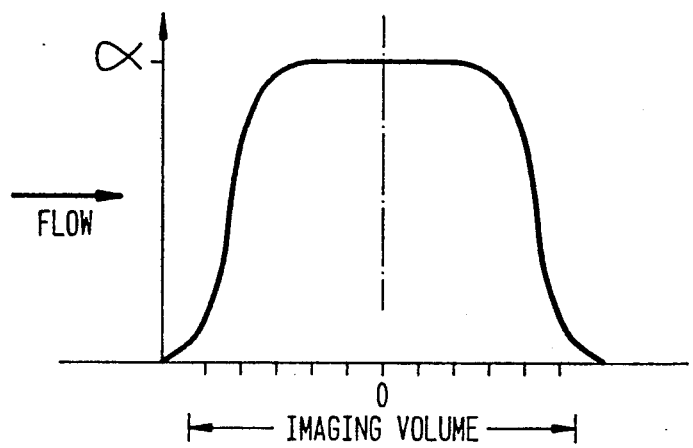
FIG. 5 illustrates a prior art RF excitation profile provided to a volume during 3-D MR imaging.

It is noted that in all known 3-D MR imaging techniques, the RF excitation pulse generally comprises a truncated since RF pulse, such as shown in FIG. 4, to produce a rectangular RF excitation profile in the imaging volume. Such an excitation profile is shown in FIG. 5. As shown therein, flow is assumed to go from left to right. Note that due to the finite duration of the RF excitation pulse, the excitation profile is not exactly rectangular. However, within a substantial part of the volume a constant flip angle is produced.

Figure 6:
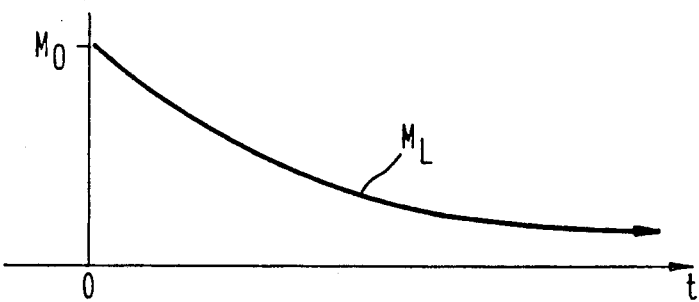
FIG. 6 illustrates the loss of longitudinal magnetization due to progressive saturation of the flowing spins as they progress through the imaging volume.

As previously described, when fully relaxed spins move into the imaging volume, their degree of saturation progressively increases, whereby the longitudinal magnetization becomes progressively decreased. This effect is shown in FIG. 6. The exact behavior of the magnetization strongly depends on the applied flip angle $\alpha$, the pulse repetition time TR, and longitudinal relaxation time T1. As previously noted, the signal that is received in an actual MR experiment directly relates to the amount of transverse magnetization, which depends on the longitudinal magnetization according to the following equation:

$$M_{transverse} = M_{longitudinal} \cdot \sin(\alpha)$$

Figure 7:
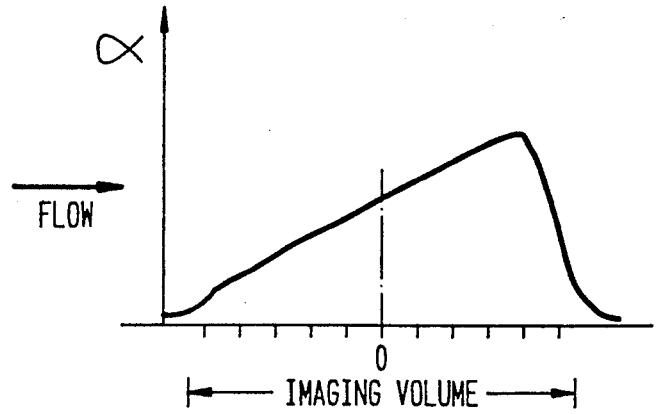
FIG. 7 illustrates an RF excitation profile provided to an imaging volume in accordance with principles of the present invention.
Figure 8:
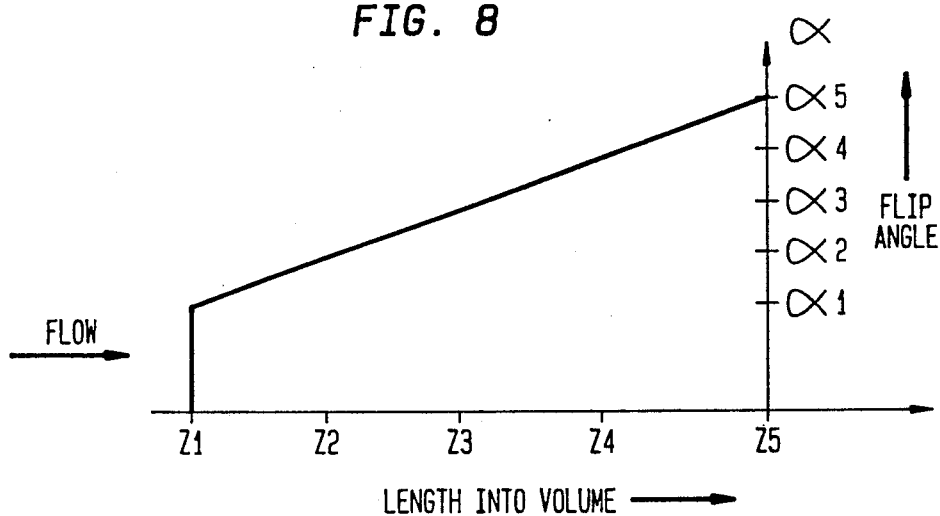
FIG. 8 illustrates a spatial flip angle variation provided in accordance with the present invention, which is experienced by flowing spins as they pass through various portions of the imaging volume.

The basic idea of the present invention is to modify the RF excitation profile in a manner so as to reduce and/or compensate for the progressive effects of flow saturation. In principle, the flip angle is caused to increase from a value of e.g., $\alpha 1$ at the inflow side of the imaging volume to a value of e.g., $\alpha 5$ at the opposite side of the volume, such as shown in FIG. 7. An exemplary RF excitation profile which is applied to the imaging volume is shown in FIG. 8, with the prior art constant flip angle profile of FIG. 5 shown in phantom in juxtaposition therewith for comparison purposes. Just as with FIG. 5, flow is assumed to go from left to right.

Assuming that a spin moves at a constant velocity v such that the location of the spin at subsequent RF pulses is given by z1, z2, z3, z4, and z5. The distance $\Delta z$ between each position is given by:

$$\Delta z = TR \cdot v$$

Figure 9:
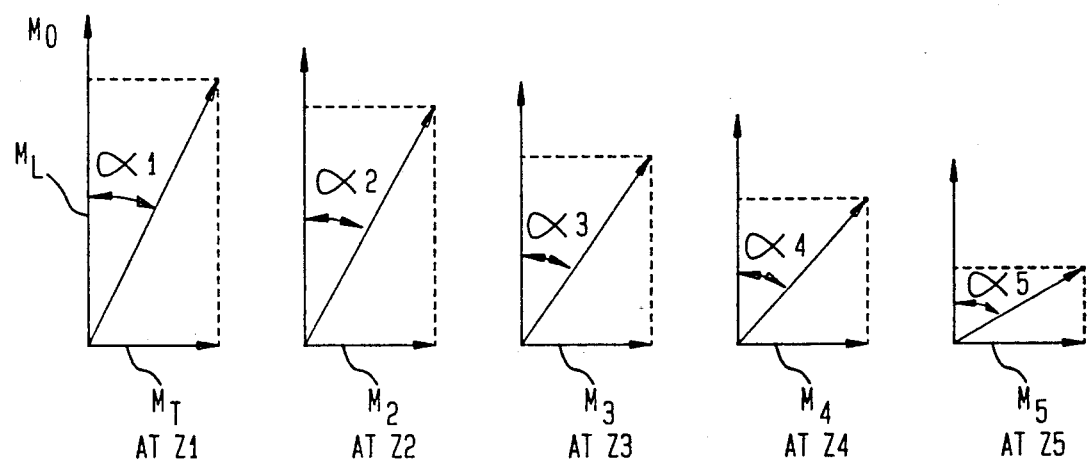
FIG. 9 illustrates the effect of a flip angle variation in accordance with a further aspect of the invention, which results in substantially constant transverse magnetization for the spins flowing through the imaging volume, and hence substantially constant imaging signal strength.

Consequently, as shown in FIG. 9, at position z1 the spin will see an RF excitation pulse which causes a flip angle of $\alpha 1$. The longitudinal magnetization is reduced, creating a transverse magnetization M1. The spin then moves on to position z2, whereby the magnetization recovers according to its longitudinal relaxation time T1. Thus, at position z2 the longitudinal magnetization will still be smaller than $M_o$ (the equilibrium magnetization). However, the flip angle at position z2 is slightly larger as compared to position z2. Therefore, the transverse magnetization created by $\alpha 2$ is the same as at position z1, despite the fact that the longitudinal magnetization has decreased. As the spins flow towards the exit plane of the volume, the decrease in longitudinal magnetization is compensated for by progressively larger flip angles. The exact increase of the flip angle that is needed to maintain a constant signal intensity throughout the volume depends on the velocity of the spins, pulse repetition time TR, and longitudinal relaxation time T1, and must therefor be adjusted by the user in accordance with his imaging requirements and hardware configuration.

Figure 10:
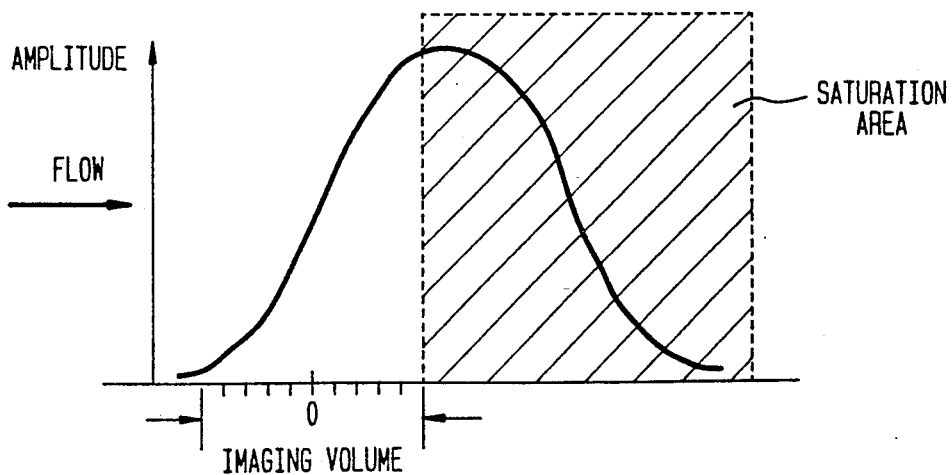
FIG. 10 illustrates and alternative RF excitation profile generated in accordance with the principles of the invention.

Thus, there has been shown and described a novel method and apparatus for improving the performance of inflow enhancement 3-D MR angiography. Many changes, modifications, variations and other uses and applications of the subject invention will, however, become apparent to those skilled in the art after considering this specification and the accompanying drawings, which disclose a preferred embodiment thereof. For example, instead of the asymmetric rf excitation profile shown in FIG. 7 a symmetric RF excitation profile can be generated, such as shown in FIG. 10. In this case, the volume of interest is centered along the leading edge of the excitation profile, and a saturation pulse, for example, would be necessary to desensitize the adjacent volume. A further modification would be to develop the RF excitation profile using a separate coil, physically displaced from the imaging. All such changes, modifications, variations and other uses and applications of the invention are deemed to be covered by the claims which follow.

I claim:

1. In a method of magnetic resonance imaging a paramagnetic material as it flows through an imaging volume, said method including the steps of: generating and applying a static magnetic field and gradient magnetic fields to the imaging volume, successively generating and applying an RF magnetic field to said imaging volume so as to exciting gyromagnetic spins in the imagining volume, detecting magnetic resonance signals emanating from the volume as a result of said RF excitation, and implementing an image-reproducing computation on the detected signals so as to develop an image, a modification of said step of successively generating an applying said RF magnetic field, comprising:

generating and applying said RF magnetic field so as to locally vary the strength of said RF excitation within said imaging volume, wherein said RF excitation results in an relatively linear increase in flip angle for material flowing through said volume.

2. A magnetic resonance imaging a paramagnetic material as it flows through an imagining volume, said imaging apparatus including:

means for generating and applying a static magnetic field and gradient fields to the imaging volume;

means for successively generating and applying to said volume an asymmetrical RF magnetic field, so as to impart an relatively linearly increasing flip angle to gyromagnetic spins of the paramagnetic material as it flows through the imaging volume, said flip angle resulting in an approximately linear increase in flip angle for material flowing through said volume;

means for detecting magnetic resonance signals emanating from the volume as a result of said applied RF magnetic field; and means for implementing an image-reproducing computation on the detected signals so as to develop an image.

* * * * *